United States Patent [19]

Bayne et al.

[11] Patent Number: 4,523,885
[45] Date of Patent: Jun. 18, 1985

[54] APPARATUS FOR LOADING MAGAZINES INTO FURNACES

[75] Inventors: Christopher J. Bayne, Lightwater; Joseph L. Lambert, Cobham; Graham E. Collyer, Ottershaw, all of England

[73] Assignee: Heraeus Quarzschmelze GmbH, Hanau, Fed. Rep. of Germany

[21] Appl. No.: 483,724

[22] Filed: Apr. 11, 1983

[30] Foreign Application Priority Data

Apr. 29, 1982 [GB] United Kingdom ................ 8212453
Aug. 26, 1982 [GB] United Kingdom ................ 8224546
Feb. 9, 1983 [GB] United Kingdom ................ 8303592
Feb. 9, 1983 [GB] United Kingdom ................ 8303596

[51] Int. Cl.³ .............................................. F27D 5/00
[52] U.S. Cl. .................................. 414/156; 432/239; 432/259
[58] Field of Search ............... 414/150, 160, 156, 198; 432/239, 259

[56] References Cited
U.S. PATENT DOCUMENTS 3,744,650 7/1973 Henebry et al. ................... 414/156

Primary Examiner—Robert G. Sheridan
Attorney, Agent, or Firm—Frishauf, Holtz, Goodman & Woodward

[57] ABSTRACT

Apparatus for introducing silicon wafers in magazines into a process tube of a furnace or diffusion oven. At least two spaced silica tubes closed at the end next adjacent the process tube constitute supporting members for the loaded magazines and a clamping device holds and supports said members cantilever-fashion by that end thereof remote from the process tube. Motor means are associated with the clamping device for moving the supporting members with the loaded magazines thereon into and out of the process tube in a substantially horizontal direction in such a manner that the magazines and their supporting members remain entirely suspended throughout the loading, processing and unloading operations: thus no part thereof comes into contact with the interior wall of the process tube. The silica tubes preferably constitute a sheathing surrounding inserts in two or more sections fitting one within the other: the insert nearest the furnace is preferably silicon carbide and the insert remote from the furnace is preferably sintered alumina.

10 Claims, 6 Drawing Figures

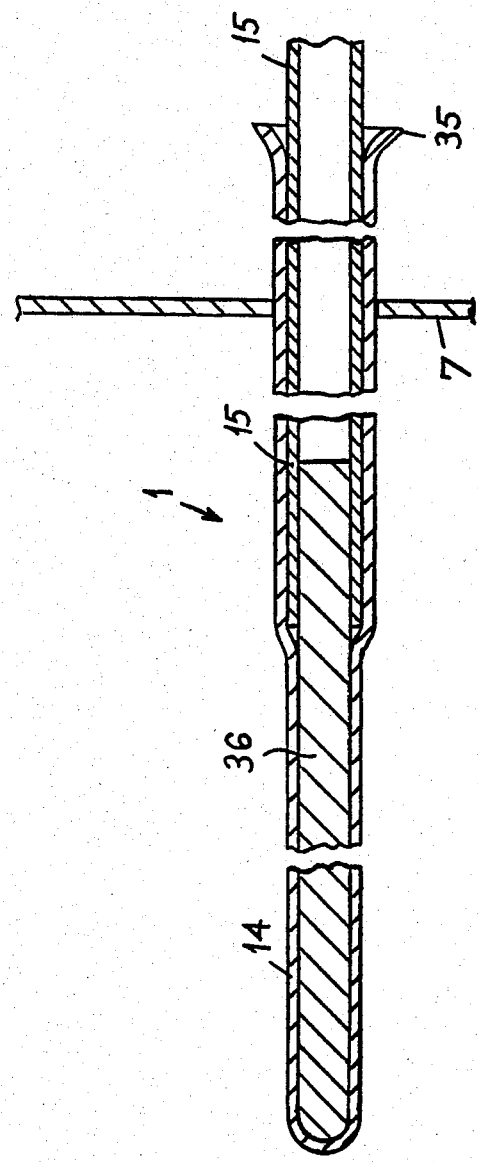

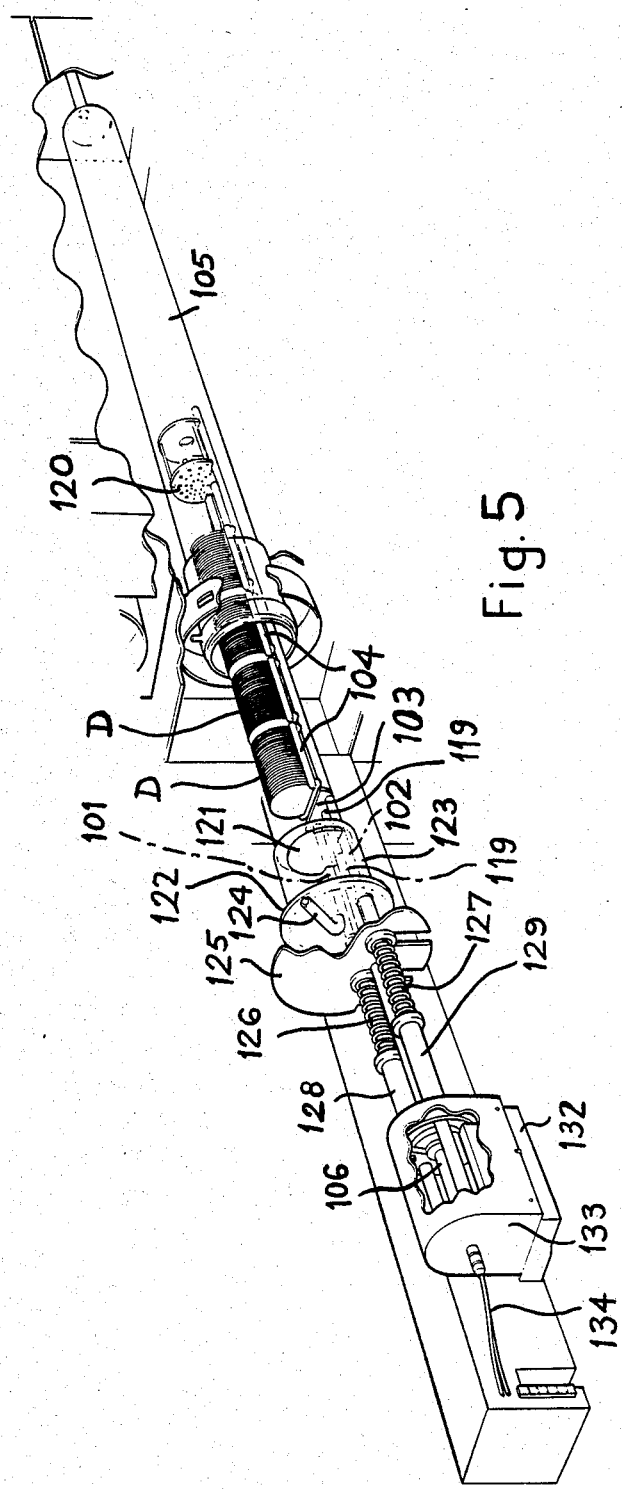

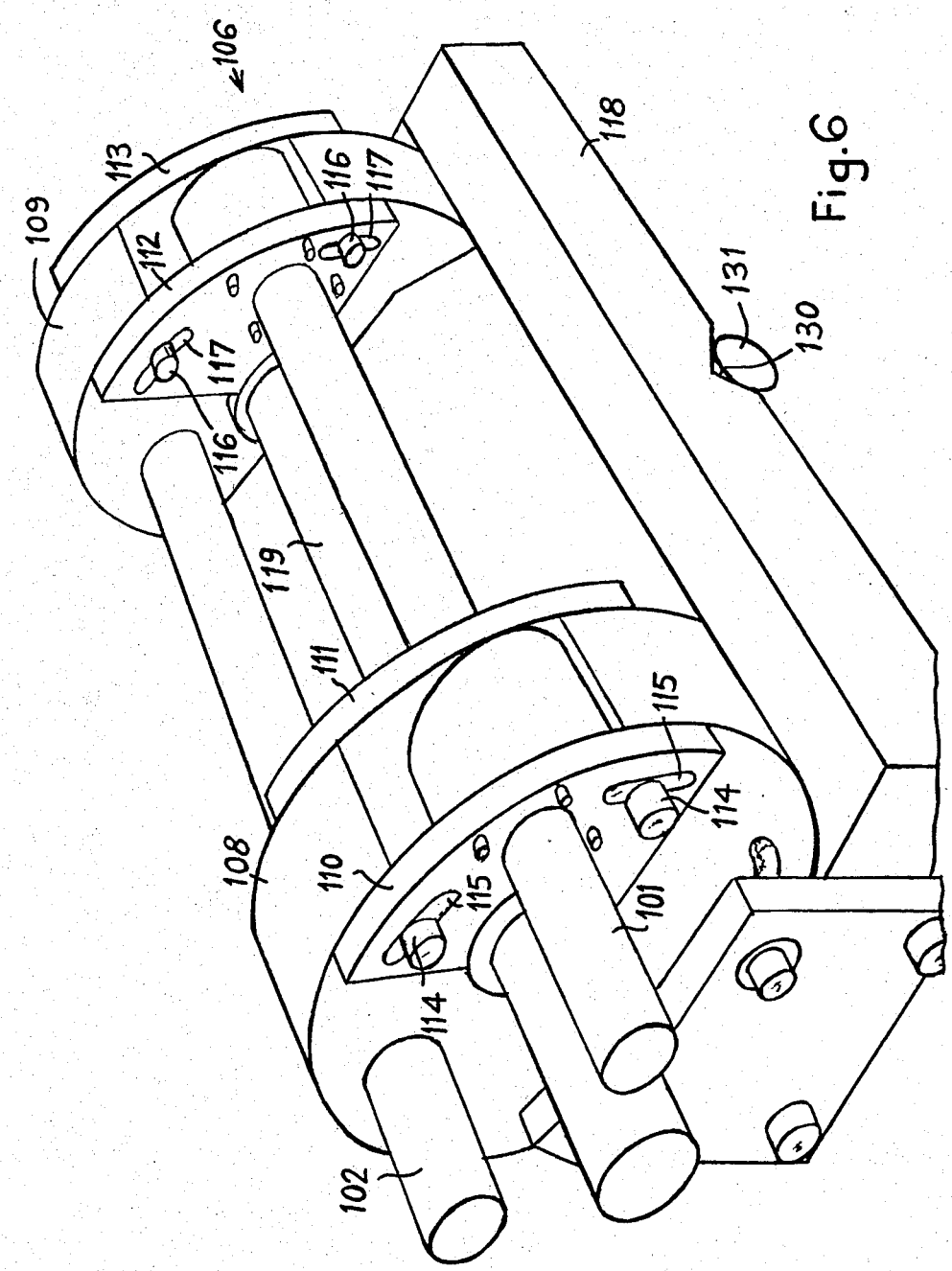

4,523,885

APPARATUS FOR LOADING MAGAZINES INTO FURNACES

BACKGROUND OF THE INVENTION

The present invention relates to apparatus for loading silicon wafers in magazines into furnaces or diffusion ovens and it is a general object of the invention to minimize the generation of dust particles as the loading device is inserted into the conventional process tube of the furnace from the outside.

Hitherto there have been used carriers comprising a pair of longitudinally extending supporting rods or tubes which, on insertion into the process tube by a suitable movement device, rub on the inside wall of the process tube and consequently generate dust which is detrimental to the processing of the wafers in the magazines. In an attempt at reducing the dust generation, there has been used in the industry a paddle comprising a set of rods or tubes provided with wheels along their length forming a wheeled carriage or trolley but these wheels also generate dust as they run on the bottom of the furnace tube.

In another proposal, described in Japanese laidopen Specification No. 56-36129 filed by Hitachi Ltd., a single large-diameter tube is employed as a magazine carrier, the forward or furnace end of which tube is cut away to leave a semi-cylindrical shell that is then provided with a base plate laid across the cut-out to constitute a platform for a magazine loaded with silicon wafers. This construction is massive and its thermal capacity is therefore high and due to the platform beneath the magazine, the efficiency of the flow of treatment gases around the wafers is effectively minimised. Moreover the end of the part of the tube within the furnace is provided with an outerplug of saddle-like form also filled with heat-insulating material to fit the upper part of the tube. This creates a back-pressure of gas at this point which also effectively minimises the efficiency of the gas flow around the wafers.

Apart from this, the cut-out weakens the cross-section of the tube and the large cross-section in itself impedes the gas flow.

THE INVENTION

It is an object to provide apparatus for the purpose hereinabove set forth which shall be strong, give a free cross-section to the flow of gas along the process tube and enable the support tubes to be individually adjustable and replaceable and, further to utilise the furnace tube space to the full and provide minimum loss of effective working space along the axis of the process tube.

Briefly, at least two spaced silica tubes are provided, closed at the end next adjacent the process tube to constitute supporting members for the loaded magazines. A clamping device for holding and supporting said supporting members is provided cantilever-fashion by that end of the supporting member which is remote from the process tube. Motor means are associated with the clamping device for moving said supporting members with the loaded magazines thereon into and out of the process tube in a substantially horizontal direction in such a manner that said magazines and their supporting members remain entirely suspended throughout the loading, processing and unloading operations, whereby no part thereof comes into contact with the interior wall of the process tube.

The strength and dimensional stability of the device, particularly at the elevated temperatures encountered within the furnace, are also important, and for these reasons the support tubes are advantageously reinforced.

BRIEF DESCRIPTION OF THE DRAWINGS

In order that the invention may be more clearly understood reference will now be made to the accompanying drawings which show certain embodiments thereof by way of example only and in which:

FIG. 4 is a cross-sectional view of a magazine-supporting tube, to a larger scale than FIG. 1 but smaller than in FIGS. 2 and 3, FIG. 5 shows a perspective view of a second embodiment of the apparatus, and FIG. 6 shows a detail of an alignment head for use with the apparatus of FIG. 4.

DETAILED DESCRIPTION OF THE PREFERRED EMBODIMENTS

Figure 1:
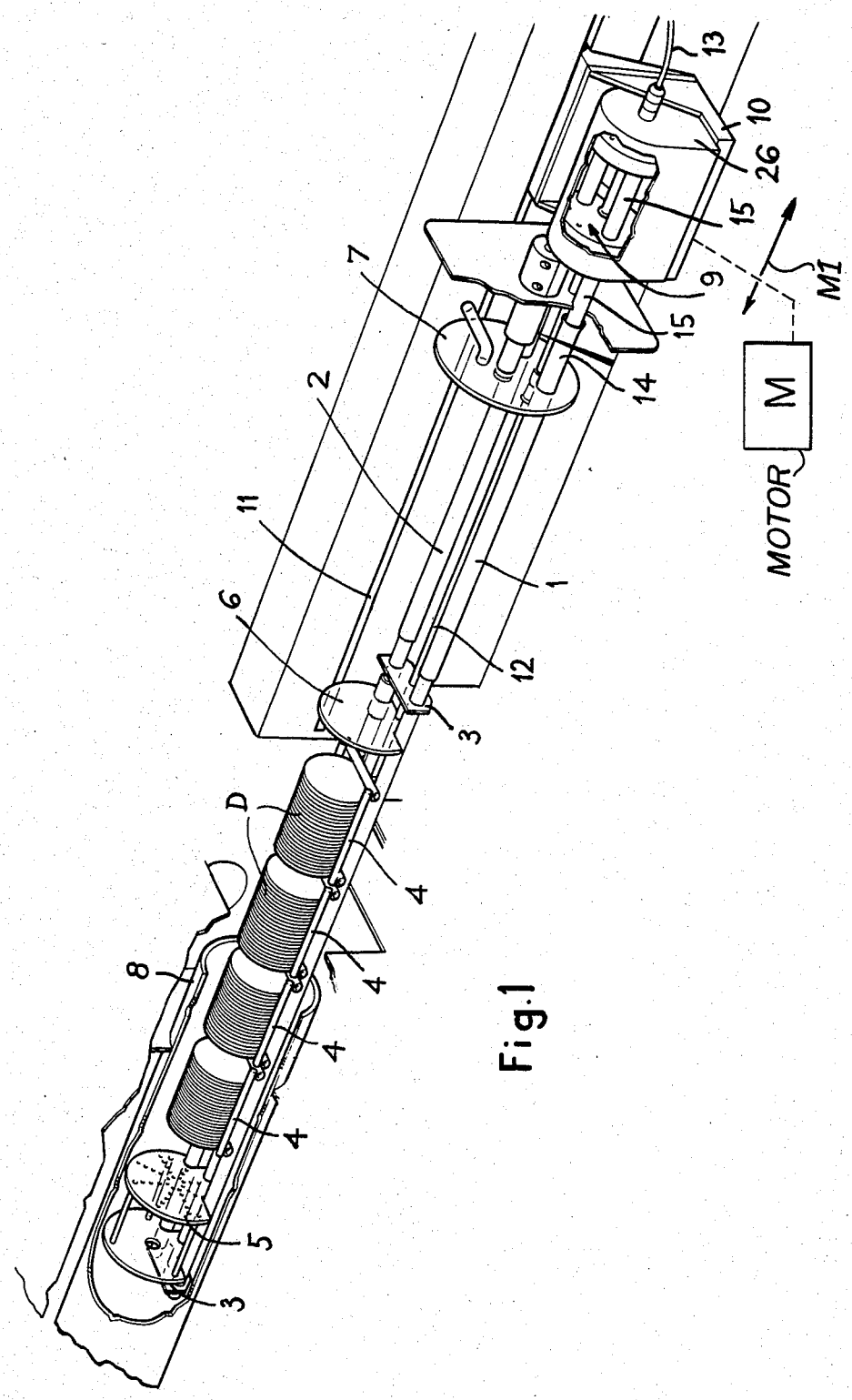
FIG. 1 shows a perspective view of a first embodiment of the apparatus with the motor means shown schematically.

Referring to the drawings, a complete assembly is shown in FIG. 1, comprising a pair of magazine-carrying support tubes generally indicated at 1 and 2, upon which coupling plates 3 are located to maintain the tubes in spaced relationship. The support tubes 1 and 2 carry one or more, typically four, magazines 4, a gas distribution baffle 5, a back baffle 6 and a furnace tube end plate 7. The magazines receive silicon wafer discs D. At the end of the support tubes 1 and 2 remote from the process tube 8 into which the loaded magazines are inserted for processing there is provided a clamping device in the form of an alignment head 9, the whole assembly being mounted on a bracket 10 which is connected by a motor means shown schematically in FIG. 1 only, to enable the whole assembly to be transported along a track 11, see arrow M1. The support tubes are held cantilever-fashion and supported from one end only, i.e. the outer end, so that their inner ends i.e. the whole length thereof and any supported magazines thereon to be transported into the process tube, do not touch the inside wall of the latter.

A third smaller diameter tube 12 may be provided, positioned below and between the two support tubes 1 and 2 to enable temperature sensors, such as thermocouples, to be positioned beneath the magazines 4 to monitor furnace temperatures during processing operations. These sensors are well known in the art and have therefore not been illustrated but their electrical connecting lead is shown at 13.

The magazine support tubes 1 and 2, one of which is described more fully with reference to FIG. 4, are of a composite construction, each comprising a commercially pure transparent vitreous silica outer tube or sheath 14, closed at its forward end next adjacent the process tube and to be received within the process tube 8. Tube or sheath 14 surrounds a rod or thick walled tube 36 of a refractory material, typically re-crystallised silicon carbide which projects from the forward end of a tube 15, also inserted in tube 14, and also of a refractory material, typically sintered alumina.

The alignment head 9 (FIG. 2) comprises two main housing discs 16 and 17 which are adjustably clamped, by means of end plates 18 and socket-head bolts 19 to a rectangular main clamp block 20 such that discs 16, 17 are perpendicular and parallel to each other. The adjustable clamp attachment enables rotational adjustment of each disc about its axis. Each main housing disc 16, 17 is drilled with three holes, one centrally at 21, the others 22 above and symmetrically disposed about the vertical axis. A short clear vitreous silica tube 23 passes through the center holes 21 of main housing discs 16 and 17 and is therein held captive by two integral flanges 24 formed on the tube 23. The remaining two holes 22 in main housing discs 16 and 17 provide location and anchorage by means of socket set-screws, not shown, screwed in holes 25 for the ends of the tubes 15, inserted into sheaths 14 of the magazine support tubes 1, 2. Thus by rotating one of the main housing discs slightly, a large deflection of the furnace ends of the support tubes 1 and 2 is effected, thereby enabling alignment adjustment of the apparatus with the furnace tube axis. The construction also enables each tube to be easily removed for replacement or refurbishing. A protective cover 26 (FIG. 1), typically of thin metal sheet, is fitted over the alignment head 9.

A furnace tube end plate 7 (FIG. 3), drilled to allow the magazine support tubes 1 and 2 and also the temperature sensor tube 12 to pass through, is flexibly attached to the alignment head 9 by a spring arrangement, thus enabling the furnace end plate 7 to be positioned and thrust against the end of the furnace tube 8. This is achieved by a spring-loaded vitreous silica sleeve or bush 27 which pushes the end plate 7 firmly against the flanged head 28 of a vitreous silica support rod 29. Rod 29 passes through an aperture in said end plate 7, and concentrically through said vitreous silica bush 27, spring 30, contained within a PTFE (polytetrafluoroethylene) sleeve 31, and is ultimately clamped into a split support block 32, which is attached via a mounting plate 33 to the main housing disc, in this embodiment disc 16, which faces the furnace tube 8. Thus furnace end plate 7 is able to align itself flat against the end of the furnace tube 8 and to allow for over-travel tolerance of the motor drive mechanism when the apparatus is inserted into the furnace for processing, and also for slight mis-alignment of the furnace tube end. The split support block mounting plate 33 is provided with slotted holes 33A (FIG. 2) to enable positional accuracy. Each of the main housing discs 16, 17 is provided with threaded holes 33B to enable the split support block 32 to be mounted at either end as appropriate.

A heat shield 34, drilled to enable the tubes 12 and 15 to pass through, manufactured from a reflective material such as polished stainless steel, is placed between the alignment head 9 and the furnace end plate 7, in particular between the split support block 32 and the PTFE sleeve 31 to prevent heat radiated from the furnace and also heat transmitted along the vitreous silica tubes from damaging the main housing disc 16 which is manufactured from a plastic material, typically polypropylene.

The sintered alumina tubes 15 project from the flared open ends 35 of the vitreous silica sheaths 14, pass through the heat shield 34 and also through the two main housing discs 16 and 17 where they are clamped in position by means of socket set screws 25. The furnace end plate 7 is provided with an exhaust pipe 36 for spent gases.

Figure 2:
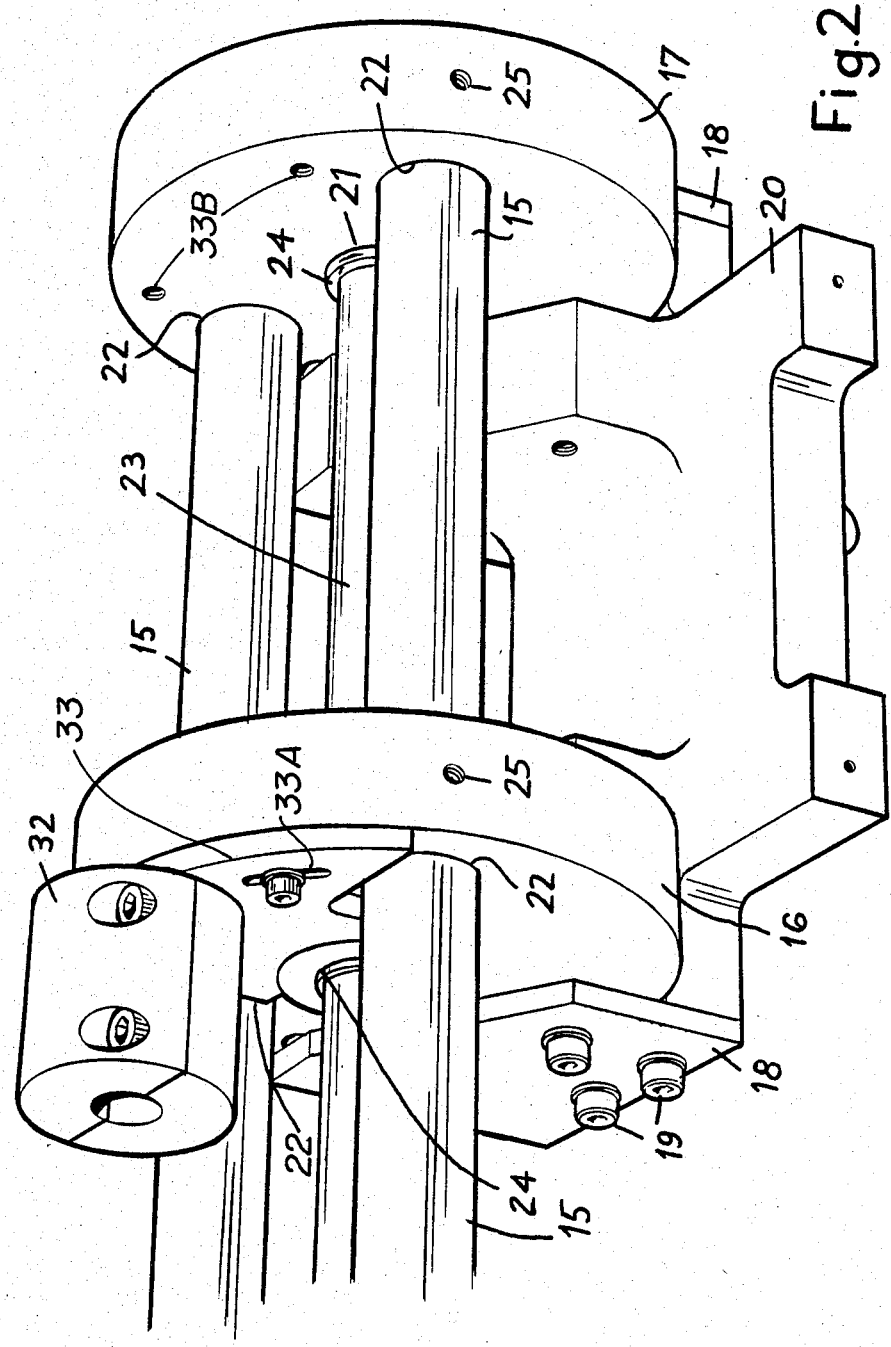
FIG. 2 shows a detail of an alignment head for the apparatus of FIG. 1 with the protective cover removed, to a larger scale.
Figure 3:
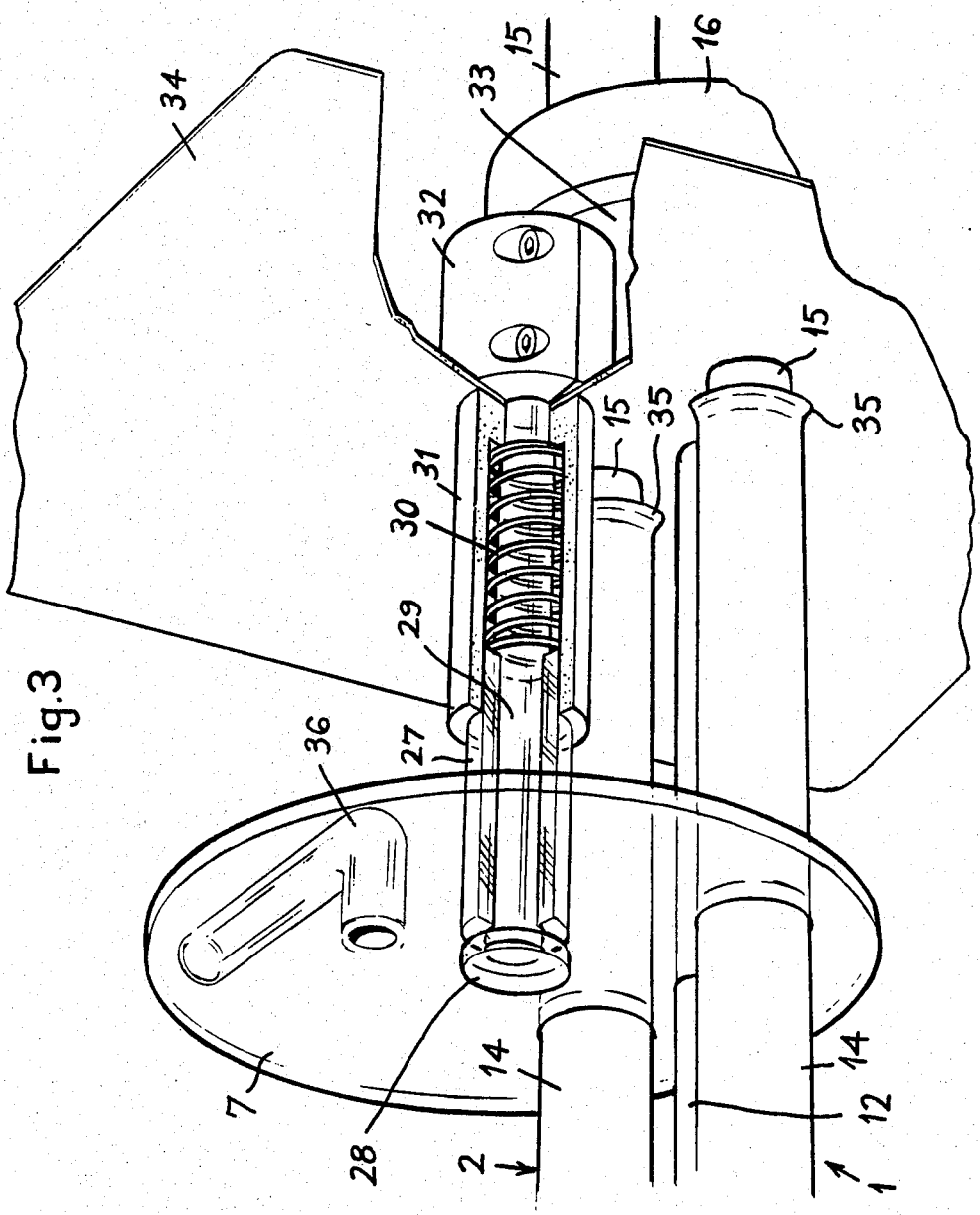
FIG. 3 shows a detail of the furnace tube and closure plate of the apparatus of FIG. 1, also to a larger scale.

FIG. 4 shows the preferred construction of the support tubes 1 and 2 of FIGS. 1 to 3.

As a consequence of the requirements of loading the magazines into the apparatus outside the furnace tube, these support tubes necessarily have an extended length, only the forward portion of tubes 1, 2 travelling right into the furnace tube and the rearward portion remaining outside it.

Extended lengths of the materials appropriate for the apparatus of the invention are extremely expensive and moreover the extended length signifies a diminution of load-bearing strength from the supported end to the unsupported end.

Preferably therefore each tube comprises a vitreous silica sheath 14 having inserts 15, 36 made up of a plurality of sections which interfit one within the other in telescopic fashion, the end of the complete member 15 having the larger dimensions being held in the clamping device or alignment head.

Generally only one forward and one rearward insert section need be provided but if desired one or more intermediate sections may be provided.

Referring now to FIG. 4, there is shown a longitudinal axial section of one of the magazine-supporting tubes of FIGS. 1 to 3 in relation to the furnace tube end plate 7. For convenience, tube 1 has been selected to be shown.

The forward end of each tube 1, 2 is required to withstand a very high temperature, e.g. 1300° C. and above, whereas the rearward end is not subject to such heat. The whole tube is divided into two sections as shown in FIG. 4, viz: a forward and a rearward section. The forward section has a rod 36 inserted and the rearward section has a tube 15 inserted in tube 14.

If desired the forward insert 36 may be a tube which is open or closed at its forward end. Rod or tube 36 is inserted telescopically within the forward end of tube 15, see FIG. 4. The degree of insertion of the rod or of the tube 36 into the tube 15 is sufficient to preserve linear integrity of the whole composite insert member 36-15, for example where the length of each forward section is 1.5 m the amount of insertion may be ½ m. The forward and rearward portions are provided with an outer sheath 14 as referred to above. The forward end of the sheath is closed in the fashion of a test tube to inhibit transfer of the process gases out of the process tube. The rear end is flared at 35.

Owing to the intense heat involved the forward and rearward insert elements must be heat compatible so that thermal expansion is matched.

It is therefore desirable to include in the construction a material which has a low thermal conductivity so as to act as a thermal barrier to prevent overheating of the alignment head.

We have found that suitable materials for the insert elements 36 and 15 are silicon carbide, sintered alumina or mono-crystalline or polycrystalline silicon, the sheath 14 being vitreous silica. Since vitreous silica does not expand very much the internal diameter of the sheath is made slightly larger than the outer diameters of the insert elements so that when the latter expand under heat the sheath does not crack. Vitreous silica is relatively inert to contamination by dopants used in the semiconductor industry and it protects the wafers from emanations from the materials of the support.

It will be seen that since relatively short sections can be used for the insert elements to make up the extended length of each composite tube, the cost of the system is considerably reduced over a system where each member is in a single length since the materials contemplated become more expensive and scarce with length.

Moreover, because the various tubes are held cantilever-fashion in the alignment head 9, it will be understood that there is an additional advantage from this construction; the insert elements can be telescoped, with increasing diameters of the individual inserts; the diameters of tubes 1, 2 increase stepwise from front to rear which stiffens the assembly, thus allowing it to carry large wafer loads at distances from the alignment head 9.

Preferably, since only the forward end of the whole tube has to travel into the process tube of the furnace, expense can be saved by having only the forward end made of an expensive heat-resistant material and the rearward end made from a relatively inexpensive material since it does not have to withstand as much heat as the forward end.

Therefore from this point of view the forward end insert is preferably silicon carbide (SiC) and the rearward end insert is sintered alumina ($Al_2O_3$).

It will be appreciated however that the materials used will depend upon the application, and the materials quoted above are only examples. Clearly other materials compatible for the same or different environmental requirements can be selected at will; for example, mono-crystalline or polycrystalline silicon may be used as one of the materials referred to, particularly for the forward insert. Moreover the sintered alumina may be replaced by non-sintered aluminium oxide of any desired form, thus including sapphire.

FIGS. 5 and 6 show a second embodiment in which the third tube is used to rigidify the structure.

FIG. 5 shows the complete assembly comprising a pair of magazine-carrying support tubes 101, 102 upon which the coupling plates 103 are located to maintain the tubes in spaced relationship, the tubes 101, 102 carrying magazines 104, and the latter receiving silicon wafer discs D as in FIG. 1. At the end of the tubes 101, 102 remote from the process tube 105 into which the loaded magazines are inserted for processing, there is provided a clamping device 106 in the form of an alignment head which is connected by a motor means (not shown) to enable the whole assembly to be transported along a track similar to the track 11 of FIG. 1 but not visible in FIG. 5. The tubes 101, 102 are held cantilever-fashion and supported from one end only so that their inner ends i.e. the whole length thereof to be transported into the process tube, do not touch the wall thereof.

In order to enable magazines 104 of different sizes to be used on the same support tubes 101 and 102, the peripheral spacing of the tubes can be varied by means of the segmented assembly shown in FIG. 6, the geometry of which is reversed as compared with FIG. 5. A pair of spaced discs 108, 109 are provided with segment plates 110, 111 and 112 and 113 whose peripheral position is adjustable by a pin and slot mechanism shown at 114, 115 and 116, 117. One of the tubes e.g. the tube 101 as shown, passes through the set of segment plates and it will be quite apparent that by slackening the pins 114, 116 the segment plates can be moved peripherally around the respective discs to enable the lateral spacing of the tube 101 to be varied as required in relation to the relatively fixed other tube, e.g. 102, which passes directly through the discs.

The whole assembly of discs and segment plates is mounted on a platform 118 which is connected to and forms part of a motor drive with which the present invention is not particularly concerned and may thus take any desired form.

To complete the arrangement, a third tube is provided as shown at 119 to rigidify the structure. This tube may also carry one or more thermo-couples to assist in the process control. Again these thermo-couples are not shown as they are known in the art and may take any desired form. A front gas diffusion baffle is shown in FIG. 5 at 120 and a plain back baffle at 121.

An end plate 122 may carry a re-entrant style end closure 123, for introduction into the process tube 105, and an exhaust pipe 124 for spent gases. If required, a heat shield 125 is provided and this forms an abutment plate for springs 126, 127 which are compressed by buffer tubes 128, 129 through which the tubes 101, 102 and 119 pass, and project from the alignment heat 106. This arrangement enables a tight sealing of the loading device against the end of the furnace tube. In order to provide horizontal adjustment of the tube assembly, the platform 118 is provided with a V-recess 130 by which it is mounted on a rod 131. The rod 131 rests on a platform 132 (FIG. 5) which is attached to the motor means and thus constitutes the driven members of the assembly. Adjustment means (not shown) are provided at each end of platform 118 to secure the latter in the adjusted position. These may take the form of lockable spacing screws.

A cover 133 may be provided for the assembly through the rear end of which pass the thermo-couple connections 134.

The tubes 101, 102 and 119 may be made from vitreous silica or other suitable material capable of resisting the furnace heat and extending the whole length of the apparatus as shown. Preferably however they are made of separate elements as described in FIG. 4.

The motor device may be computer-controlled if necessary or found desirable.

The embodiments set forth above exhibit an open structure to the flow of gases along the furnace tube giving the gases easy access to the wafers in their open magazines, without material impediment and the creation of back pressures, to the end of the process tube. The mass of the support tubes is at a minimum and thus presents a very low thermal capacity. Due to the structure, the profile of the assembly is very low and as a result the diameter of the furnace tube can be kept to a minimum, and need not be very much greater than that of the actual wafers being processed. This reduction of process tube dimensions brings about measurable economics in running costs since clearly the expenditure of heat energy necessary for the processing is at a minimum and the recovery time is low.

Moreover the structure is strong and the construction of the alignment heads enables the disposition of the tubular supports to be adjusted to the optimum within the furnace tube. Moreover the individual tubes are exchangeable readily for replacement or refurbishing and can be individually adjustable, there is no loss of furnace tube space and there is minimum loss of effective working space along the axis of the furnace tube.

We claim:

1. Apparatus for introducing silicon wafers (D) in magazines (4,104) into a process tube (8,105) of a furnace or diffusion oven, comprising
   at least two spaced silica tubes closed at their forward ends, next adjacent the process tube (8), to constitute supporting members (1,2; 14; 101,102) for the loaded magazines (4,104),
   a clamping device (9,106) for holding and supporting said members (1,2; 14; 101,102) cantilever-fashion by that end of each member which is remote from the process tube (8),
   motor means (M) associated with said clamping device (9,106) for moving said supporting members with the loaded magazines thereon into and out of the process tube (8) in a substantially horizontal direction (M1); and
   at least one insert (15,36) reinforcing each supporting member (1,2; 14; 101,102),
   said magazines (4,104) and their supporting members (1,2; 14; 101,102) remaining entirely suspended throughout the loading, processing, and unloading operations, and out of contact with the interior wall of the process tube (8).

2. Apparatus according to claim 1, wherein the silica tubes (1,2; 14; 101,102) are held in spaced relationship by coupling plates (3,103) through which said tubes pass.

3. Apparatus according to claim 1, wherein the at least one insert comprises at least two inserts (15,36), which interfit one (36) within the other (15) in telescopic fashion, the end of the telescopically interfitting member (15) having the larger dimensions being held in said clamping device (9,106).

4. Apparatus according to claim 3, wherein the forward section of each said insert is a rod.

5. Apparatus according to claim 3, wherein each said insert is made from a material selected from the group comprising silicon carbide, monocrystalline silicon, polycrystalline silicon and aluminium oxide.

6. Apparatus according to claim 3, wherein the forward one of said insert member is made from a material different from the rearward one thereof.

7. Apparatus according to claim 6, wherein the forward one of said inserts is made from silicon carbide and the rearward one thereof is made from aluminum oxide.

8. Apparatus according to claim 7, wherein said rearward insert is made from sintered alumina.

9. Apparatus according to claim 1, wherein a rigidifying tube is provided between two said supporting members, said members and said rigidifying tube being mounted by one end in said clamping device.

10. Apparatus according to claim 1, wherein said clamping device comprises two main housing discs adjustably clamped to a main clamp block to retain said discs in parallel relationship, said main housing discs being bored to allow said support tubes to pass therethrough, said support tubes being locked in place by means of screw devices passing through said main housing discs.

* * * * *